United States Patent
Lee et al.

(10) Patent No.: US 7,687,847 B2
(45) Date of Patent: Mar. 30, 2010

(54) SEMICONDUCTOR DEVICE AND FABRICATING METHOD THEREOF

(75) Inventors: Wen-Fang Lee, Hsinchu (TW); Dave Hsu, Hsinchu County (TW); Asam Lin, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 42 days.

(21) Appl. No.: 11/737,714

(22) Filed: Apr. 19, 2007

(65) Prior Publication Data

US 2007/0187779 A1    Aug. 16, 2007

Related U.S. Application Data

(62) Division of application No. 11/064,231, filed on Feb. 22, 2005, now Pat. No. 7,294,548.

(51) Int. Cl.
*H01L 29/788* (2006.01)

(52) U.S. Cl. .................. 257/315; 257/500; 257/501; 257/506; 257/E29.33; 257/E21.613; 257/E21.66; 257/E21.678; 257/E21.683; 257/E21.691; 257/E27.064; 257/E29.021; 257/E29.129; 257/E29.304; 257/317; 257/390; 257/391; 257/510

(58) Field of Classification Search .................. None
See application file for complete search history.

(56) References Cited

U.S. PATENT DOCUMENTS

| 6,271,572 | B1 * | 8/2001 | Fujita | 257/392 |
| 6,689,653 | B1 * | 2/2004 | Seah et al. | 438/201 |
| 2005/0117443 | A1 * | 6/2005 | Park et al. | 365/232 |

* cited by examiner

*Primary Examiner*—Minh-Loan T Tran
*Assistant Examiner*—Fei Fei Yeung Lopez
(74) *Attorney, Agent, or Firm*—J.C. Patents

(57) ABSTRACT

A method of fabricating a semiconductor device is described. A substrate having a memory cell region and a high voltage circuit region are provided. First and second source/drain regions are formed in the substrate within these two regions. A silicon oxide layer, a first conductive layer and a top layer are sequentially formed over the substrate. A floating gate is defined in the memory cell region and the top layer and the first conductive layer of the high voltage circuit region are removed. The exposed silicon oxide layer is thickened. Thereafter, the top layer is removed and then a barrier layer is formed on the exposed surface of the floating gate. A second conductor layer is formed over the substrate, and then a gate is defined in the high voltage circuit region and a control gate is defined in the memory cell region.

4 Claims, 3 Drawing Sheets

SEMICONDUCTOR DEVICE AND FABRICATING METHOD THEREOF

CROSS-REFERENCE TO RELATED APPLICATION

This application is a divisional application of, and claims the priority benefit of, U.S. application Ser. No. 11/064,231 filed on Feb. 22, 2005.

BACKGROUND OF THE INVENTION

1. Field of the Invention

The present invention relates to a method of fabricating an integrated circuit. More particularly, the present invention relates to a semiconductor device and a fabricating method thereof.

2. Description of the Related Art

Because of the special circuit design, non-volatile memory allows multiple data writing, reading and erasing operations and the stored data will be retained even after power to the device is removed. Furthermore, with the advantages of occupying a small volume, having a high access speed and consuming very little power, non-volatile memories have great demands in the market. The single-layered polysilicon one-time programmable device is presently the only conventional non-volatile memory that can integrate with high voltage devices in the same process. Because the single-layered polysilicon one-time programmable device has a structural design similar to a high-voltage device, processing integration is easier and mostly adopted by manufacturers. Yet, the single-layered polysilicon one-time programmable device has a low tolerance and the number of reuses of the device is not to exceed several tens. Obviously, this is a severe restriction on its widespread adoption.

Although most conventional electrically erasable programmable read-only-memory (EEPROM) can be accessed a large number of times, the memory cell needs to have at least two polysilicon layers, one serving as a floating gate layer while the other serving as a control gate. Since two polysilicon layers are required to form the memory cell in the EEPROM, the difference in height between the memory cell and the high-voltage devices in other circuit region is normally big. Hence, integrating the process of fabricating memory devices and high-voltage devices is difficult. Even when it is necessary to fabricate memories and high-voltage devices within the same chip, extra photomasks are often required resulting in more complicated steps, longer fabricating cycles and higher production cost.

SUMMARY OF THE INVENTION

Accordingly, at least one objective of the present invention is to provide a method of fabricating a semiconductor device capable of integrating the fabrication of electrically erasable programmable read-only-memories and high-voltage devices together without using additional photomasks.

At least a second objective of the present invention is to provide a method of fabricating a semiconductor device not only capable of resolving the problems of integrating electrically erasable programmable read-only-memories and high-voltage devices together, but also capable of integrating these two devices with low-voltage devices or other semiconductor devices and hence increasing the production yield.

At least a third objective of the present invention is to provide a semiconductor memory device suitable for high-voltage operation and the number of repetitive writing or erasing operations through memory devices thereof can be increased and the stored data can be retained for a longer period.

To achieve these and other advantages and in accordance with the purpose of the invention, as embodied and broadly described herein, the invention provides a method of fabricating a semiconductor device. First, a substrate is provided. The substrate comprises a memory cell region and a high voltage circuit region. Then, first source/drain regions are formed in the memory cell region of the substrate and second source/drain regions are formed in the high-voltage circuit region of the substrate. Thereafter, a silicon oxide layer, a first conductive layer and a top layer are sequentially formed over the substrate. The top layer and the first conductive layer are patterned to define a floating gate in the memory cell region. In the meantime, the top layer and the first conductive layer within the high voltage circuit region are removed. An oxidation process is performed to thicken the exposed silicon oxide layer. Thereafter, the top layer in the memory cell region is removed and a barrier layer is formed on the exposed surface of the floating gate. A second conductor layer is formed over the substrate to cover the silicon oxide layer and the barrier layer. Then, the second conductive layer is patterned to define a gate in the high-voltage circuit region and a control gate in the memory cell region.

According to a preferred embodiment of the present invention, before forming the first and the second source/drain regions, further comprises forming a high-voltage well in the substrate.

According to a preferred embodiment of the present invention, the silicon oxide layer underneath the first conductive layer has a thickness between about 50 Å to 150 Å.

According to a preferred embodiment of the present invention, the thickened silicon oxide layer has a thickness between about 700 Å to 1000 Å.

According to a preferred embodiment of the present invention, the thickened silicon oxide layer covers the sidewalls of the floating gate.

According to a preferred embodiment of the present invention, the oxidation process includes a thermal oxidation process.

According to a preferred embodiment of the present invention, the barrier layer includes silicon oxide.

According to a preferred embodiment of the present invention, the control gate has a dimension greater than that of the floating gate.

The present invention also provides an alternative method of fabricating a semiconductor device. First, a substrate is provided. The substrate comprises a memory cell region, a high-voltage circuit region and a low-voltage circuit region. Then, first source/drain regions are formed in the memory cell region of the substrate and second source/drain regions are formed in the high-voltage circuit region of the substrate. Thereafter, a silicon oxide layer, a first conductive layer and a top layer are sequentially formed over the substrate. The top layer and the first conductive layer are patterned to define a floating gate in the memory cell region. In the meantime, the top layer and the first conductive layer in the high-voltage region are removed, and the top layer and the first conductive layer in the low-voltage circuit region are retained. An oxidation process is carried out to thicken the exposed silicon oxide layer. After that, the top layer as well as the first conductive layer and the silicon oxide layer in the low-voltage circuit region are removed. Next, a barrier layer is formed on the exposed surface of the floating gate and a gate insulation layer is formed in the low-voltage circuit region of the substrate. A second conductive layer is formed over the substrate to cover the gate insulation layer, the silicon oxide layer and the barrier layer. The second conductive layer is patterned to define a control gate in the memory cell region, a first gate in the high-voltage circuit region and a second gate in the low-voltage circuit region.

According to a preferred embodiment of the present invention, before forming the first and the second source/drain regions, further comprises forming a high voltage well in the memory cell region and high voltage circuit region of the substrate.

According to a preferred embodiment of the present invention, the silicon oxide layer underneath the first conductive layer has a thickness between about 50 Å to 150 Å.

According to a preferred embodiment of the present invention, the thickened silicon oxide layer has a thickness between about 700 Å to 1000 Å.

According to a preferred embodiment of the present invention, the thickened silicon oxide layer covers the sidewalls of the floating gate.

According to a preferred embodiment of the present invention, the barrier layer within the memory cell region is fabricated using a material identical to the gate insulation layer in the low-voltage circuit region.

According to a preferred embodiment of the present invention, the control gate in the memory cell region has a dimension greater than that of the floating gate.

According to a preferred embodiment of the present invention, after forming the second gate, further comprises forming third source/drain regions in the low-voltage circuit region of the substrate.

According to a preferred embodiment of the present invention, the oxidation process includes a thermal oxidation process.

The present invention also provides a semiconductor device. The semiconductor device comprises a substrate, a first source/drain region, a second source/drain region, a first gate insulation layer, a second gate insulation layer, a floating gate, a control gate, a barrier layer and a gate. The substrate comprises a memory cell region and a high-voltage circuit region. The first source/drain region is disposed in the substrate within the memory cell region. The second source/drain region is disposed in the substrate within the high-voltage circuit region. The first gate insulation layer is disposed on the substrate within the memory cell substrate. The second gate insulation layer is disposed on the substrate within the high-voltage circuit region. The second gate insulation layer has a thickness greater than that of the first gate insulation layer. Furthermore, the floating gate is disposed on the first gate insulation layer and the control gate is disposed above the floating gate. The control gate has a dimension greater than the floating gate. In addition, the barrier layer is disposed between the floating gate and the control gate, and the gate is disposed on the second gate insulation layer.

In one preferred embodiment, the first source/drain region and the second source/drain region have identical depth and dopant concentration.

In one preferred embodiment, the substrate further comprises a low-voltage circuit region, and the low-voltage circuit region has a plurality of low-voltage devices.

In the present invention, the process of fabricating the memory cells and the high-voltage devices are integrated together without the need for additional photomasks. Hence, the processing time and production cost are reduced. Furthermore, the process of fabricating memory cells and high-voltage devices in the present invention can integrate with low-voltage devices or other logic devices too.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
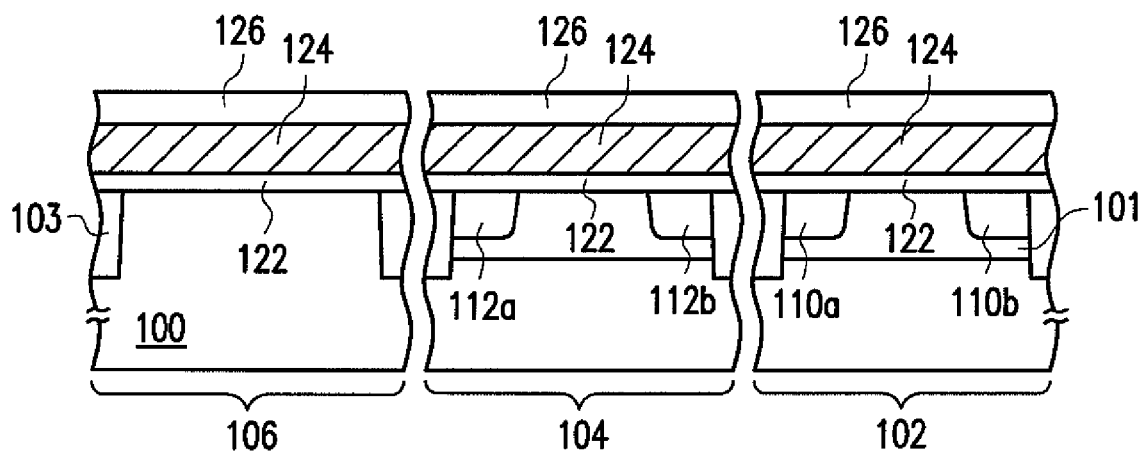
FIGS. 1A through 1G are schematic cross-sectional views showing the steps for fabricating a semiconductor device according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1G are schematic cross-sectional views showing the steps for fabricating a semiconductor device according to one preferred embodiment of the present invention. As shown in FIG. 1A, the method of fabricating the semiconductor device in the present invention includes providing a substrate 100. The substrate 100 includes a memory cell region 102, a high-voltage circuit region 104 and a low-voltage circuit region 106. The substrate 100 is a silicon substrate, for example, and the silicon substrate 100 has a dopant type that matches the type of the desired semiconductor devices. For example, the substrate 100 may be a P-type silicon substrate or an N-type silicon substrate. Thereafter, an isolation structure 103 is formed on the substrate 100 to define a plurality of active device regions (not shown) and separate the memory cell region 102, the high-voltage circuit region 104 and the low-voltage circuit region 106. The isolation structure 103 is a field oxide layer formed by performing local oxidation silicon (LOCOS) process or a shallow trench isolation (STI) structure as shown in FIG. 1A.

In one preferred embodiment, before or after forming the isolation structure 103, further comprises forming a high-voltage well 101 in the substrate 100 within the memory cell region 102 and the high-voltage circuit region 104. The method of forming the high-voltage well 101 includes performing an ion implantation, for example. The high-voltage well 101 can be a P-type dopant implanted or an N-type dopant implanted region depending on the type of the desire semiconductor devices. Thereafter, a first source region 110a and a first drain region 110b are formed in the substrate 100 within the memory cell region 102 and a second source region 112a and a second drain region 112b are formed in the substrate 100 within the high-voltage circuit region 104. The method of forming the source regions 110a, 112a and the drain regions 110b, 112b includes performing an ion implantation process and then performing a thermal treatment to diffuse the implanted dopants. In one preferred embodiment, the first source/drain regions 110a, 110b and the second source/drain regions 112a, 112b are formed in the same step so that the depth and dopant concentration of these two source/drain regions are identical.

Thereafter, a silicon oxide layer 122, a conductive layer 124 and a top layer 126 are sequentially formed over the substrate 100. The silicon oxide layer 122 formed within the memory cell region 102 serves as a first gate insulation layer subsequently. In one preferred embodiment, the silicon oxide layer 122 is formed in a thermal oxidation process, a chemical vapor deposition process or other suitable processes. In one preferred embodiment, the silicon oxide layer has a thickness between about 50 Å to 150 Å. The first conductive layer 124 is fabricated using polysilicon or other suitable conductive materials, for example. The first conductive layer 124 is formed, for example, by performing a chemical vapor deposition process. The top layer 126 is a silicon nitride layer or other suitable dielectric material layer formed, for example, by performing a chemical vapor deposition process.

Figure 1B:
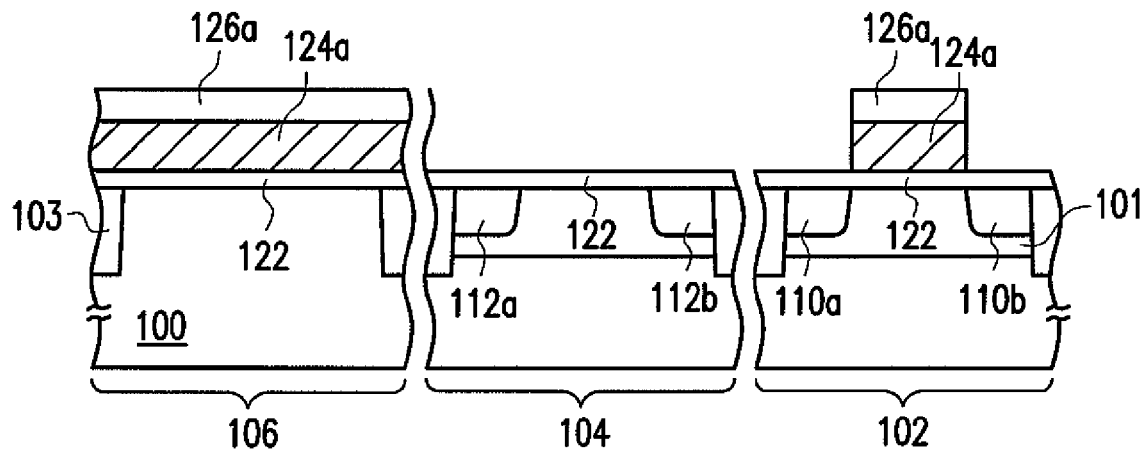

As shown in FIG. 1B, the top layer 126 and the first conductive layer 124 are patterned to form a patterned top layer 126a and a patterned conductive layer 124a. In the meantime, the top layer 126 and the first conductive layer 124 within the high-voltage circuit region 104 are removed. The conductive layer 124a retained within the memory cell region 102 serves as a floating gate. The method of patterning the top layer 126 and the first conductive layer 124 and removing the top layer 126 and the first conductive layer 124 in the high-voltage circuit region but retaining the top layer 126a and the first conductive layer 124a in the low-voltage circuit region includes performing a photolithographic process and an etching process, for example.

Figure 1C:
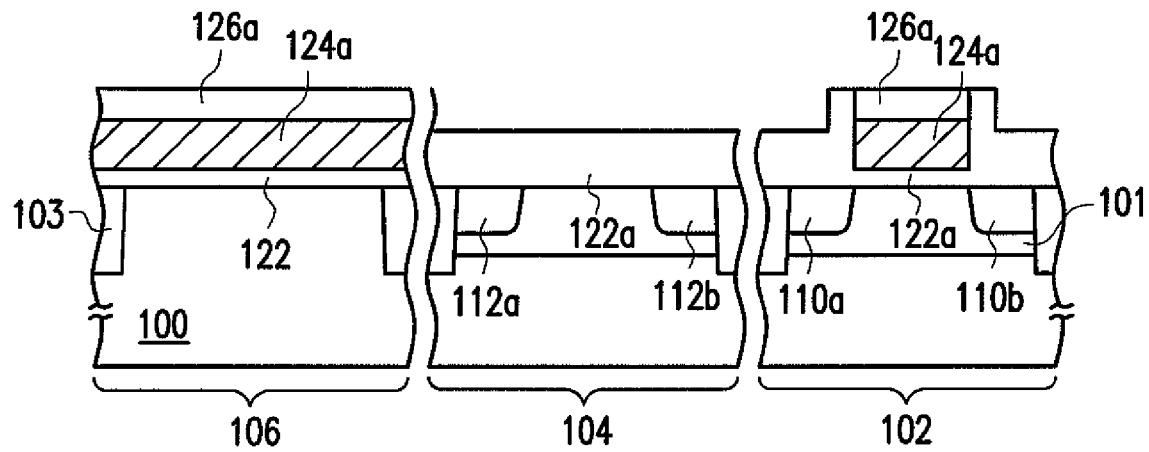

As shown in FIG. 1C, an oxidation process is carried out to thicken the exposed silicon oxide layer 122 into a thickened silicon oxide layer 122a. The thickened silicon oxide layer 122a is formed, for example, by performing a thermal oxidation process. The thickened silicon oxide layer 122a has a thickness between about 700 Å to 1000 Å, for example. In one preferred embodiment, the thickened silicon oxide layer 122a inside the memory cell region covers the sidewalls of the floating gate 124a.

Figure 1D:
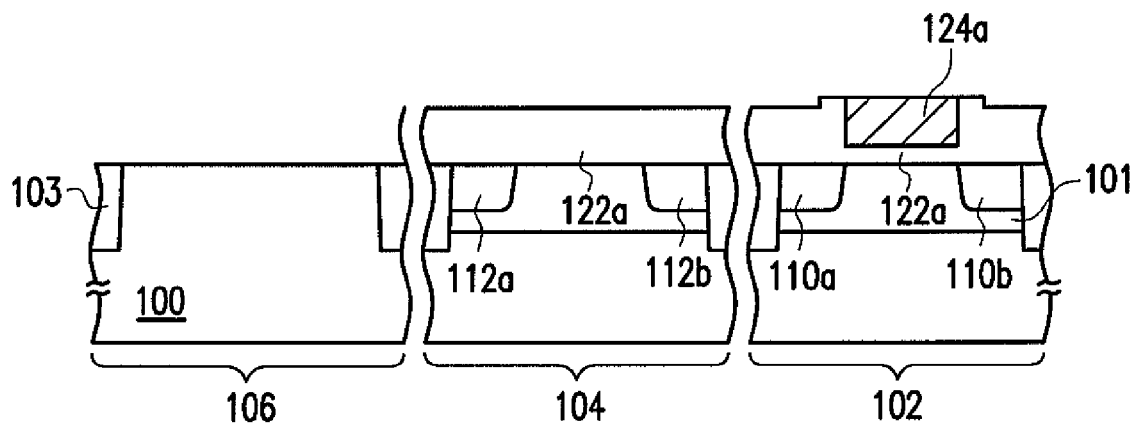

As shown in FIG. 1D, the top layer 126a in the memory cell region 102 and the top layer 126a in the low-voltage circuit region 106 are removed. Thereafter, the first conductive layer 124a and the silicon oxide layer 122 in the low-voltage circuit region 106 are removed.

Figure 1E:
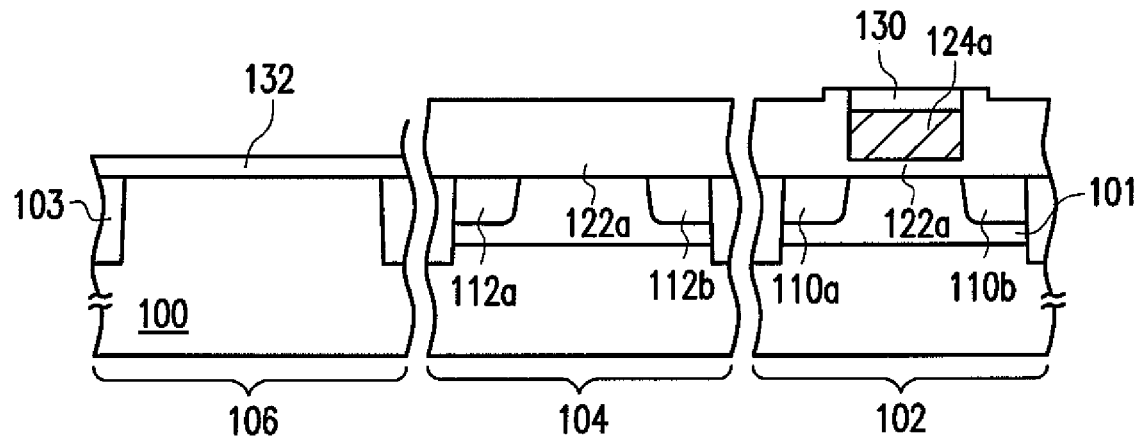

As shown in FIG. 1E, a barrier layer 130 is formed on the exposed floating gate 124a in the memory cell region 102 and a gate insulation layer 132 is formed on the substrate 100 in the low-voltage circuit region 106. In one preferred embodiment, the barrier layer 130 in the memory cell region 102 and the gate insulation layer 132 in the low-voltage circuit region 106 are fabricated using an identical material such as silicon oxide formed in a thermal oxidation process or a chemical vapor deposition process, for example.

Figure 1F:
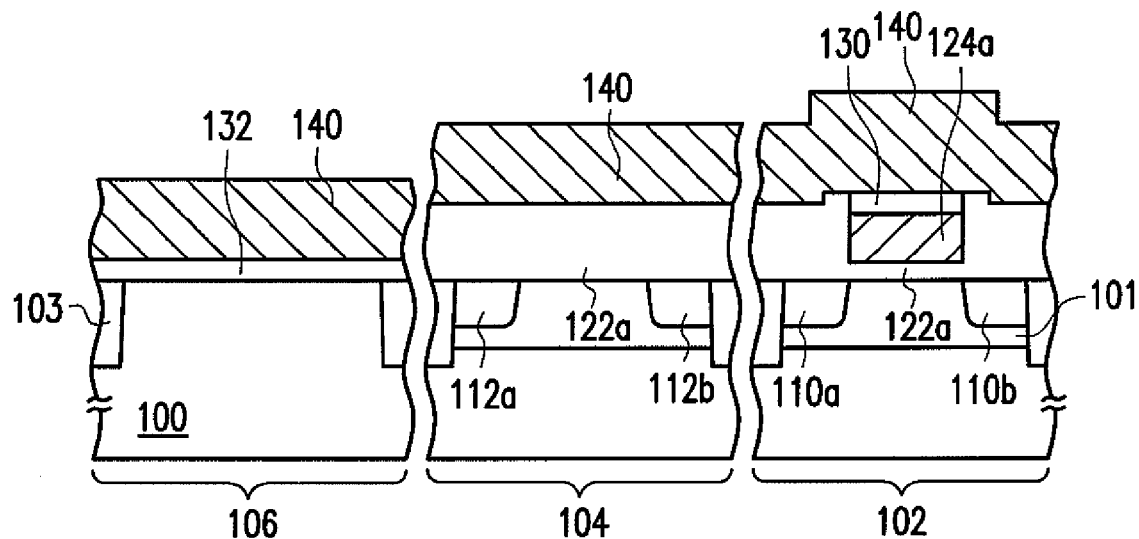

As shown in FIG. 1F, a second conductive layer 140 is formed over the substrate 100 to cover the gate insulation layer 132 in the low-voltage circuit region, the silicon oxide layer 122a in the high-voltage circuit region 104 and the barrier layer 130 in the memory cell region 102. The second conductive layer 140 is a polysilicon layer formed, for example, by performing a chemical vapor deposition process.

Figure 1G:
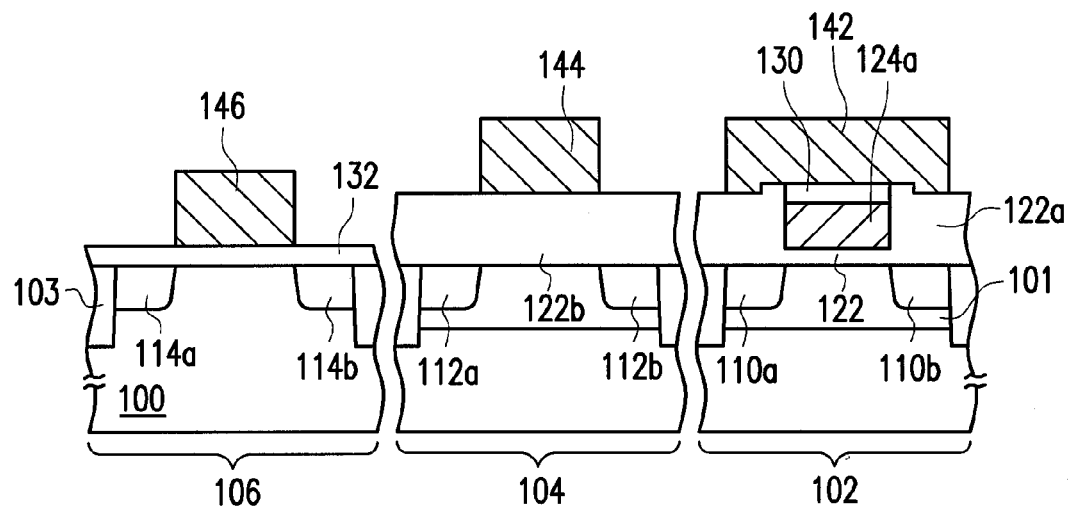

As shown in FIG. 1G, the second conductive layer 140 is patterned to define a control gate 142 in the memory cell region, a first gate 144 in the high-voltage circuit region 104 and a second gate 146 in the low-voltage circuit region 106. The method of defining the gate includes performing a photolithographic process and an etching process, for example.

In one preferred embodiment, the control gate 142 in the memory cell region 102 has a dimension greater than that of the floating gate 124a.

In another embodiment, after forming the second gate 146, further comprises forming a third source region 114a and a third drain region 114b in the substrate 100 within the low-voltage circuit region 106.

In particular, the low-voltage devices within the low-voltage circuit region 106 is not limited to a single type of low-voltage device. It can be a multitude of low voltage logic devices such as a series of low voltage device each having a different gate insulation layer thickness.

Figure 2:
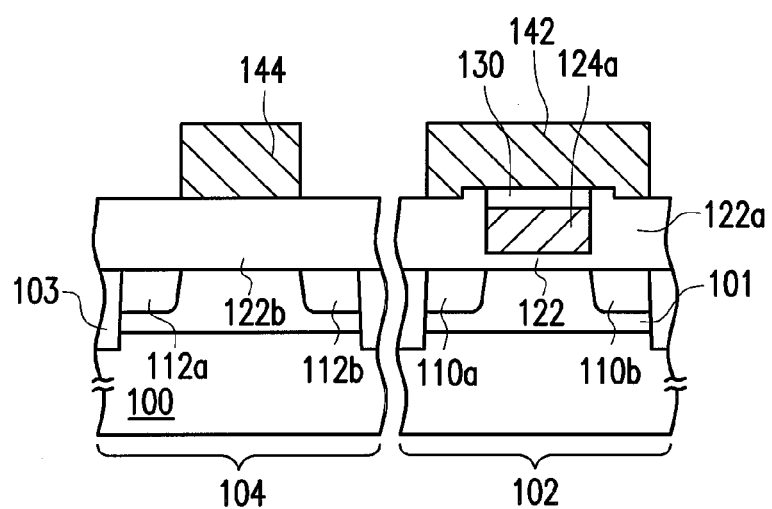
FIG. 2 is a schematic cross-sectional view showing the structure of a semiconductor device according to one preferred embodiment of the present invention.

Although the integration of the memory cell region 102, the high-voltage circuit region 104 and the low-voltage circuit region 106 are described in the aforementioned embodiment, the present invention can be applied to integrate just the high-voltage circuit region 104 and the memory region 102 as shown in FIG. 2. The process of integrating the memory cell region 102 with the high-voltage circuit region 104 can be carried out first before integrating with other devices or circuits.

FIG. 2 is a schematic cross-sectional view showing the structure of a semiconductor device according to one preferred embodiment of the present invention. As shown in FIG. 2, the semiconductor device comprises a memory cell region 102 and a high-voltage circuit region 104. The memory cell region 102 has first source/drain regions 110a/110b, a first gate insulation layer (the oxide layer 122a), a floating gate 124a, a barrier layer 130 and a control gate 142. The first source/drain regions 110a/110b are disposed in the substrate 100 within the memory cell region 102. The first gate insulation layer (the oxide layer 122a) is disposed on the substrate 100 within the memory cell region 102. The floating gate 124a is disposed on the first gate insulation layer (the oxide layer 122a). The control gate 142 is disposed above the floating gate 124a. The control gate 142 has a dimension greater than the floating gate 124a. The barrier layer 130 is disposed between the floating gate 124a and the control gate 142.

The high-voltage circuit region 104 has second source/drain regions 112a/112b, the second gate insulation layer 122b and the gate 144. The second source/drain regions 112a/112b are disposed in the substrate 100 within the high-voltage circuit region 104. The second gate insulation layer 122b is disposed on the substrate 100 within the high-voltage circuit region 104. The second gate insulation layer 122b has a thickness greater than that of the first gate insulation layer 122a. The gate 144 is disposed on the second gate insulation layer 122b.

In one preferred embodiment, the depth and dopant concentration of the first source/drain regions 110a/110b in the substrate 100 within the memory cell region 102 and that of the second source/drain regions 112a/112b in the substrate 100 within the high-voltage circuit region 104 are identical.

In another embodiment, aside from the memory cell region 102 and the high-voltage circuit region 104, the semiconductor device further comprises a low-voltage circuit region 106 as shown in FIG. 1G. The low-voltage circuit region 106 comprises a plurality of low voltage devices. Each low-voltage device comprises third source/drain regions 114a/114b, a gate insulation layer 132 and a second gate 146. The third source/drain regions 114a/114b are disposed in the substrate 100 within the low-voltage circuit region 106. The gate insulation layer 132 is disposed on the substrate 100 within the low-voltage circuit region 106. The second gate 146 is disposed on the gate insulation layer 132.

In summary, the electrically erasable programmable read-only-memory in the present invention can integrate with the fabrication of high voltage devices or with additional low voltage devices without the need for additional photomasks. Hence, the processing time and production cost can be reduced. Furthermore, because the memory devices inside the semiconductor device with high-voltage devices are electrically erasable programmable read-only-memories, the number of data writing and erasing operations and the data retention period is increased considerably.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a substrate having a memory cell region and a high-voltage circuit region;
   a first source/drain region disposed in the substrate within the memory cell region;
   a second source/drain region disposed in the substrate within the high-voltage circuit region;
   a first gate insulation layer disposed on the substrate within the memory cell region;
   a second gate insulation layer disposed on the substrate within the high-voltage circuit region, wherein the second gate insulation layer has a thickness greater than that of the first gate insulation layer;
   a floating gate disposed on the first insulation layer;
   a thickened silicon oxide layer covering a sidewall of the floating gate;
   a control gate disposed above the floating gate, wherein the control gate has a dimension greater than that of the floating gate;
   a barrier layer disposed between and in direct contact with the floating gate and the control gate, wherein a thickness of the barrier layer is less than a thickness of the thickened silicon oxide layer on the sidewall of the floating gate; and
   a gate disposed on the second gate insulation layer.

2. The semiconductor device of claim 1, wherein the depth and dopant concentration of the first source/drain region and the second source/drain region are identical.

3. The semiconductor device of claim 1, wherein the substrate further comprises a low-voltage circuit region having a plurality of low voltage devices therein.

4. The semiconductor device of claim 1, wherein a thickness of the second gate insulation layer is about 750 to 1000 angstroms thick.

* * * * *